United States Patent
Hu et al.

(10) Patent No.: US 10,080,085 B2
(45) Date of Patent: Sep. 18, 2018

(54) LOUDSPEAKER NONLINEAR COMPENSATION METHOD AND APPARATUS

(71) Applicant: AAC Technologies Pte. Ltd., Singapore (SG)

(72) Inventors: Yuxiang Hu, Shenzhen (CN); Jing Lu, Shenzhen (CN); Henglizi Zhang, Shenzhen (CN)

(73) Assignee: AAC TECHNOLOGIES PTE. LTD., Singapore (SG)

( * ) Notice: Subject to any disclaimer, the term of this patent is extended or adjusted under 35 U.S.C. 154(b) by 11 days.

(21) Appl. No.: 15/587,547

(22) Filed: May 5, 2017

(65) Prior Publication Data

US 2017/0353795 A1  Dec. 7, 2017

(30) Foreign Application Priority Data

Jun. 7, 2016 (CN) .......................... 2016 1 0398572

(51) Int. Cl.
  *H04R 3/08* (2006.01)
  *H04R 29/00* (2006.01)
  (Continued)

(52) U.S. Cl.
  CPC ............. *H04R 3/08* (2013.01); *H04R 29/003* (2013.01); *H03G 7/002* (2013.01); *H03G 9/005* (2013.01);
  (Continued)

(58) Field of Classification Search
  CPC .......... H04R 3/08; H04R 29/003; H04R 3/02; H04R 29/001; H04R 2430/03; H03G 7/002; H03G 9/005; H03G 9/025
  See application file for complete search history.

(56) References Cited

U.S. PATENT DOCUMENTS

2003/0142832 A1* 7/2003 Meerkoetter ........ H04R 29/003
                                                              381/59
2003/0187636 A1* 10/2003 Klippel ................ H04R 29/001
                                                              704/220
(Continued)

FOREIGN PATENT DOCUMENTS

CN        10144269 B   *  4/2014

OTHER PUBLICATIONS

Oyen, Compensation of loudspeaker linearities, Jul. 2007.*
(Continued)

*Primary Examiner* — Davetta W Goins
*Assistant Examiner* — Kuassi Ganmavo
(74) *Attorney, Agent, or Firm* — Na Xu; IPro, PLLC (57) ABSTRACT

The invention provides a loudspeaker nonlinear compensation method. The method includes steps: obtaining system parameter of the loudspeaker, the No. i time-domain excitation voltage signal and the No. i state vector of the loudspeaker; compensating the No. i time-domain excitation voltage signal according to the system parameter and the No. i state vector and obtain i compensation voltage signal; obtaining the No. i+1 state vector according to the calculation of the system parameter and the No. i compensation voltage signal; outputting the No. i compensation voltage signal and record the quantity of the compensation voltage signal; judging whether the quantity of the compensation voltage signal is equal to the preset number value.

3 Claims, 6 Drawing Sheets

(51) Int. Cl.
  *H04R 3/02*  (2006.01)
  *H03G 9/00*  (2006.01)
  *H03G 7/00*  (2006.01)
  *H03G 9/02*  (2006.01)

(52) U.S. Cl.
  CPC ............... *H03G 9/025* (2013.01); *H04R 3/02* (2013.01); *H04R 29/001* (2013.01); *H04R 2430/03* (2013.01)

(56) References Cited

U.S. PATENT DOCUMENTS

2006/0274904 A1* 12/2006 Lashkari ............... H03F 1/3264
  381/59
2010/0092004 A1* 4/2010 Kuze ..................... H04R 3/08
  381/71.11
2013/0230191 A1* 9/2013 Hoang Co Thuy ...... H04R 3/08
  381/104
2015/0124982 A1* 5/2015 Berthelsen ........... H04R 29/001
  381/59

OTHER PUBLICATIONS

Shurer et al, Theoretical and Experimental Comparison of the three methods for compensation of electrodynamic transducer nonlinearity, AES, 1998.*

Bjork et al; Linearization of micro loudspeakers using adaptive control; 2014.*

Jensen et al; Non Linear Time Domain Modeling of balanced armatures receivers; AES; 2011.*

Hu et al, Compensating the distortion of microspeakers in a closed box with consideration of nonlinear mechanical resistance, ASa,2017.*

Klippel, Dominant Nonlinearities in microspeakers; 2013.*

* cited by examiner

LOUDSPEAKER NONLINEAR COMPENSATION METHOD AND APPARATUS

CROSS-REFERENCE TO RELATED APPLICATIONS

This application claims the priority benefit of Chinese Patent Application Ser. No. 201610398572.9 filed on Jun. 7, 2016, the entire content of which is incorporated herein by reference.

FIELD OF THE PRESENT DISCLOSURE

The present disclosure relates to the field of loudspeaker, especially to one kind of loudspeaker nonlinear compensation method and apparatus.

DESCRIPTION OF RELATED ART

Loudspeaker has the advantage of small size, therefore it is used widely in the smart cell phone and tablet PC etc electronic equipment. With the reduction of size, the nonlinearity of loudspeaker becomes more and more obvious. Under large signal condition, sound from loudspeaker will generate obvious distortion. People pay more and more attention to carry out nonlinear compensation for loudspeaker according to the non-linear model of the system of loudspeaker and corresponding system parameter.

The many nonlinear methods of compensation of many loudspeaker of the existing technology.

For example, there is one kind of feedback linearization nonlinear method of compensation in the existing technology. This method can control effectively force factor $Bl(x)$, coefficient of stiffness $k_t(x)$ and nonlinearity introduced by voice coil inductance $L_e(x)$. It plays certain role of compensating loudspeaker. But this method cannot compensate the nonlinearity of mechanical resistance $R_m(v)$, which has small applicable scope and does not apply to micro loudspeaker unit especially.

There is one kind of nonlinear control system of loudspeaker in the existing technology. This system adopts feedback linearization compensation algorithm to compensate the nonlinearity of system. But this method does not apply to micro loudspeaker. In addition, it adopts mirror filter method in the existing technology to compensate the nonlinearity of system. However this method is one special situation of feedback linearization compensator and can only be applied to the nonlinear compensation of woofer which has small scope of application and does not apply to micro loudspeaker unit specially.

In addition, there is one kind of method and apparatus used for the distortion and compensation for the nonlinearity of loudspeaker system. This method needs transfer the audio signal into frequency domain system and then transfer frequency domain signal into time-domain signal instead of compensating time-domain voltage signal. It is more complicated.

Therefore it is necessary to provide one kind of nonlinear method of compensation and apparatus of new-type loudspeaker to overcome the shortcomings of small scope of application of existing nonlinear compensation technology instead of compensating time-domain excitation voltage signal.

BRIEF DESCRIPTION OF THE DRAWING

Many aspects of the exemplary embodiment can be better understood with reference to the following drawing. The components in the drawing are not necessarily drawn to scale, the emphasis instead being placed upon clearly illustrating the principles of the present disclosure.

DETAILED DESCRIPTION OF THE EXEMPLARY EMBODIMENT

The present disclosure will hereinafter be described in detail with reference to an exemplary embodiment. To make the technical problems to be solved, technical solutions and beneficial effects of the present disclosure more apparent, the present disclosure is described in further detail together with the figure and the embodiment. It should be understood the specific embodiment described hereby is only to explain the disclosure, not intended to limit the disclosure.

Figure 1:
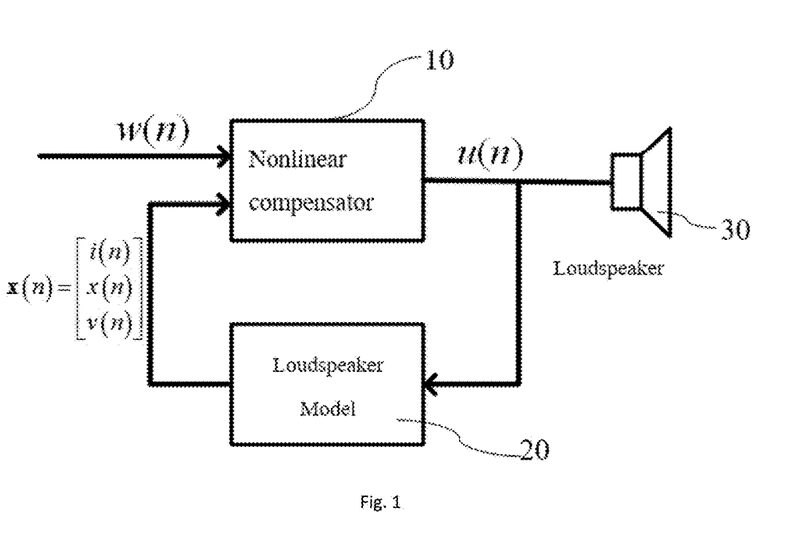
FIG. 1 is the basic principle frame of a nonlinear method of compensation of the loudspeaker of example of the invention.

FIG. 1 shows the basic principle of loudspeaker nonlinear method of compensation of example according to the invention. Further, w(n) represents the initial excitation voltage of system and u(n) represents the compensation voltage after compensation. x represents system vector, among which the system vector includes current i, displacement of a vibrating diaphragm x and velocity of the diaphragm v, namely:

$$x=[x_1 x_2 x_3]^T=[ixv]^T \qquad (1)$$

Shown as FIG. 1, firstly, the initial excitation voltage w(n) combines the current system parameter and the current state vector and compensate through nonlinear compensator 10 to obtain the compensation voltage u(n) after compensation. Afterwards, forecast and obtain the next state vector x of system according to the compensation voltage u(n), system parameter by combining loudspeaker model 20. Afterwards, use compensation voltage u(n) excitation loudspeaker 30 to realize the effective compensation for nonlinearity of loudspeaker 30, among which, the compensation voltage u(n) preferably is output through the power amplifier.

In the example, before compensate for the first time through the nonlinear compensator 10 and set the preset state vector for the loudspeaker 30. Compensate the initial excitation voltage by using feedback linearization compensation algorithm etc. compensation algorithm through current system parameter and preset vector.

In the following compensation process, the state vector is obtained and solved through previous compensation voltage and system parameter.

Preferably, preset state vector is x1=[0 0 0]T.

Figure 2:
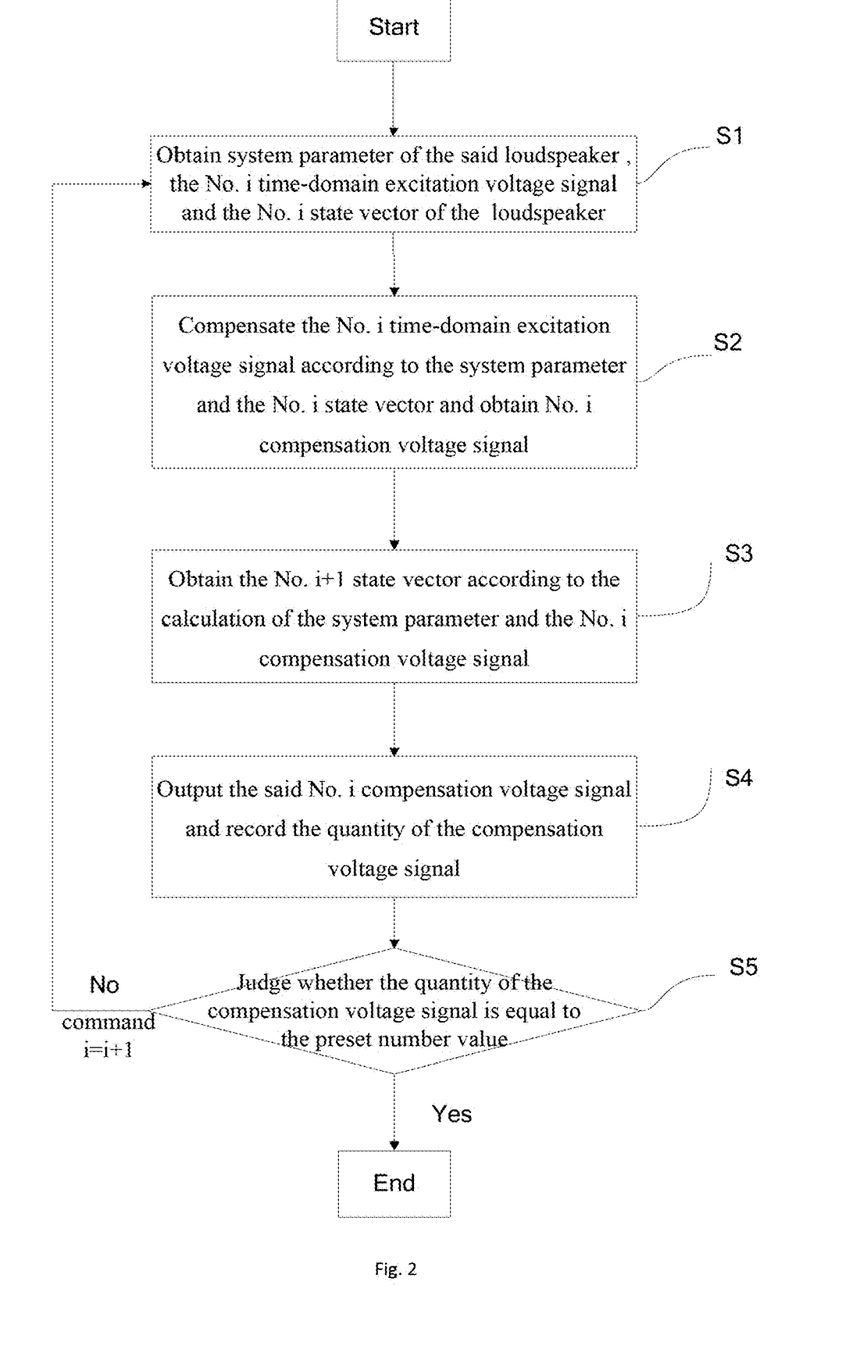
FIG. 2 is the flow chart corresponding to the nonlinear method of compensation of FIG. 1.

FIG. 2 is the flow chart of loudspeaker nonlinear method of compensation. It is shown as FIG. 2, the compensation method includes the following steps:

S1. Obtain the system parameter of loudspeaker, the No. i time-domain excitation voltage signal and the No. i state vector of the loudspeaker, among which i is the natural number.

S2. Compensate the No. i time-domain excitation voltage signal according to the system parameter and the No. i state vector and obtain the No. i compensation voltage signal.

S3. Obtain the No. i+1 state vector according to the system parameter and the No. i compensation voltage signal S4. Output the No. i compensation voltage signal and record the quantity of the compensation voltage signal.

S5. Judge whether the quantity of the compensation voltage signal is equal to preset number value, if so, terminate compensation. If not, command i=i+1, return and execute step S1.

Among which, in the example, in the step S1, system parameter of the loudspeaker includes linear parameters and nonlinear parameters. Among which, linear parameter includes voice coil DC resistance $R_e$, voice coil inductance $L_e$, force factor linear term $b_0$, coefficient of stiffness linear term $k_0$ and mechanical resistance linear term $r_0$. However nonlinear parameter includes force factor $Bl(x)$, coefficient of stiffness $k_t(x)$ and mechanical resistance $R_m(v)$. The nonlinear compensation method in the can control the nonlinearity of the above-mentioned three parameters effectively. Among which, force factor $Bl(x)$, coefficient of stiffness $k_t(x)$ and mechanical resistance $R_m(v)$ can be represented by adopting the following various forms respectively.

$$Bl(x) = \sum_{j=0}^{N} b_j x^j \quad (2)$$

$$k_t(x) = \sum_{j=0}^{N} k_j x^j$$

$$R_m(v) = \sum_{j=1}^{N} r_j v^j$$

Among which, as described above, x represents the displacement of diaphragm, and v represents the velocity of the vibrating diaphragm.

In addition, the system parameter in step S1 can be the system parameter measured at the initial stage, which is no longer measured during the subsequent non-linear compensation. The system parameter can also be that of the loudspeaker, which is obtained in the process of non-linear compensation by synchronizing the measurement of the voltage and current across the loudspeaker with the system identification method to update.

Further, as shown in FIG. 2, when i=1 in step S1, the No. i state vector is the preset state vector of the loudspeaker. Preferably, in the present embodiment, the preset state vector is x1=[0 0 0] T. And when 1<i⩽n, the No. i+1 state vector can be obtained according to the system parameter and the No. i compensation voltage signal as disclosed in step S3, for example, solving the ordinary differential equation. That is, the No. i state vector is calculated from the system parameter and the i−1-compensated voltage signal, for example, by solving the ordinary differential equation, where the ordinary differential equation can be derived from the lumped parameter model of the loudspeaker.

Figure 3:
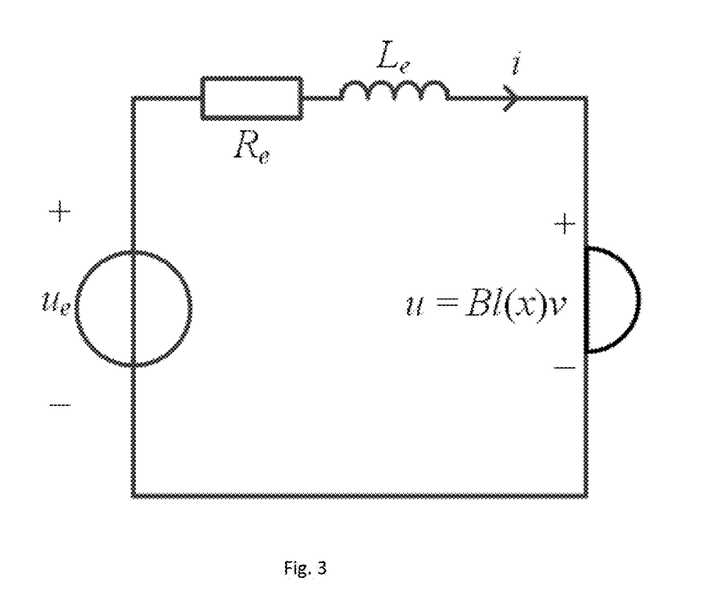
FIG. 3 is the voltage model in the lumped parameter model of the loudspeaker nonlinear method of compensation in the example of the invention.
Figure 4:
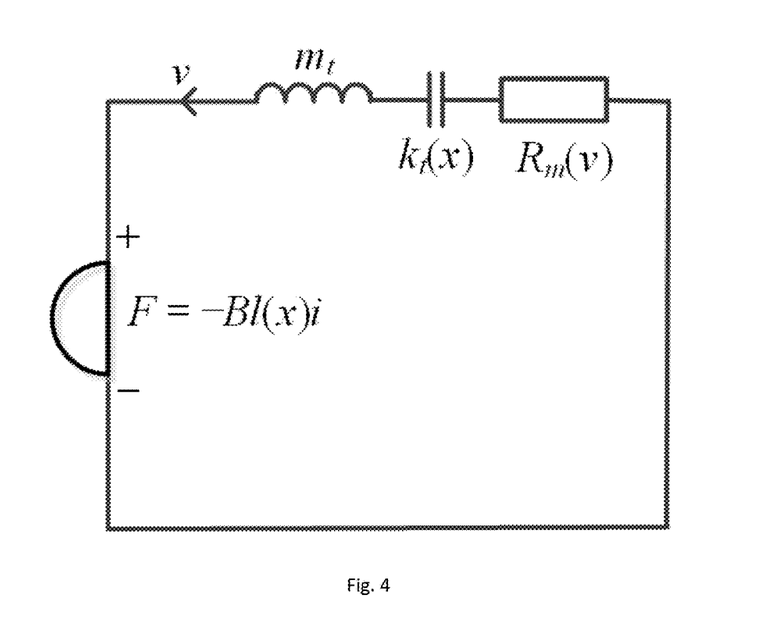
FIG. 4 is the mechanical model of lumped parameter model of loudspeaker nonlinear method of compensation of example of the invention.

FIGS. 3-4 shows a lumped parameter model in an embodiment of the present invention. In FIG. 3, the voltage model of the loudspeaker is shown in detail. The voltage model can be expressed by the following formula:

$$u_e = R_e i + Bl(x)v + L_e \frac{di}{dt} \quad (3)$$

where, u(t) represents the excitation voltage of the loudspeaker, $R_e$ is voice coil DC resistance, $L_e$ is voice coil inductance, and I is current.

FIG. 4 shows the mechanical model of the loudspeaker. The mechanical model can be expressed by the following formula:

$$Bl(x)i = m_t a + R_m(v)v + k_t(x)x \quad (4)$$

where $m_t$ is the equivalent vibration mass and a is the acceleration of diaphragm.

The ordinary differential equation of the loudspeaker can be obtained by the above equations (3) and (4). Wherein the ordinary differential equation is as shown in the following equation (5):

$$\dot{x} = \begin{bmatrix} -\frac{R_e}{L_e} x_1 - \frac{Bl(x_2)}{L_e} x_3 + \frac{u(t)}{L_e} \\ x_3 \\ \frac{Bl(x_2)}{m_t} x_1 - \frac{k_t(x_2)}{m_t} x_2 - \frac{R_m(x_3)}{m_t} x_3 \end{bmatrix} \quad (5)$$

Since the vibration velocity of diaphragm v can be solved by the ordinary differential equation, the nonlinearity of $R_m(v)$ can be effectively suppressed and compensated when the nonlinear compensation method is adopted. In the step S3 of present embodiment, the current state vector is obtained by solving the ordinary differential equation (5) based on the loudspeaker system parameter and the previous compensation voltage signal preferably. Then, based on the system parameter and the solution of the current state vector, the feedback linearization compensation algorithm is used to compensate the current time domain excitation voltage signal directly, and the compensation voltage u can be obtained.

The compensation voltage u can be expressed as:

$$u = \frac{L_e}{Bl(x_2)} \left\{ \begin{array}{l} \left[\frac{R_e}{L_e} + \frac{r_0}{m_t} - \frac{R_{mx}(x_3)x_3 + R_m(x_3)}{m_t}\right][-Bl(x_2)x_1 + k_r(x_2)x_2 + R_m(x_3)x_3] - \\ x_3[Bl_x(x_2)x_1 - k_{rx}(x_2)x_2 - k_t(x_2) + k_0] - \frac{R_e}{L_e}(k_0 x_2 + r_0 x_3) + \frac{b_0}{L_e}(w - b_0 x_3) \end{array} \right\} + R_e x_1 + Bl(x_2)x_3 \quad (6)$$

where w is the original excitation voltage of the system, $B_f x$, $k_f x$ and $R_m x$ represent the first derivative of $Bl(x)$, $k_t(x)$ and $R_m(v)$ respectively. In the case of non-linear compensation, the system's non-linearity cannot be completely suppressed by the system parameter obtained only at the initial stage of the measurement because there are the system parameter measurement errors, and the parameters of the speaker may be drifted at run-time.

Therefore, the present invention further proposes that the latest system parameter of the loudspeaker is obtained by the system identification method during the nonlinear compensation process.

Figure 5:
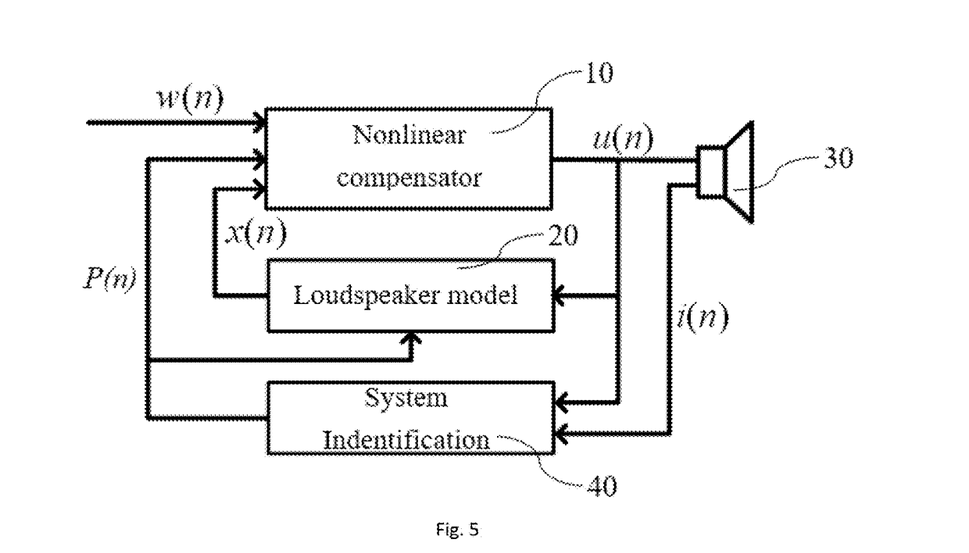
FIG. 5 is the basic principle frame of loudspeaker nonlinear method of compensation of obtaining system parameter of loudspeaker by using system recognition method in the example of the invention.
Figure 6:
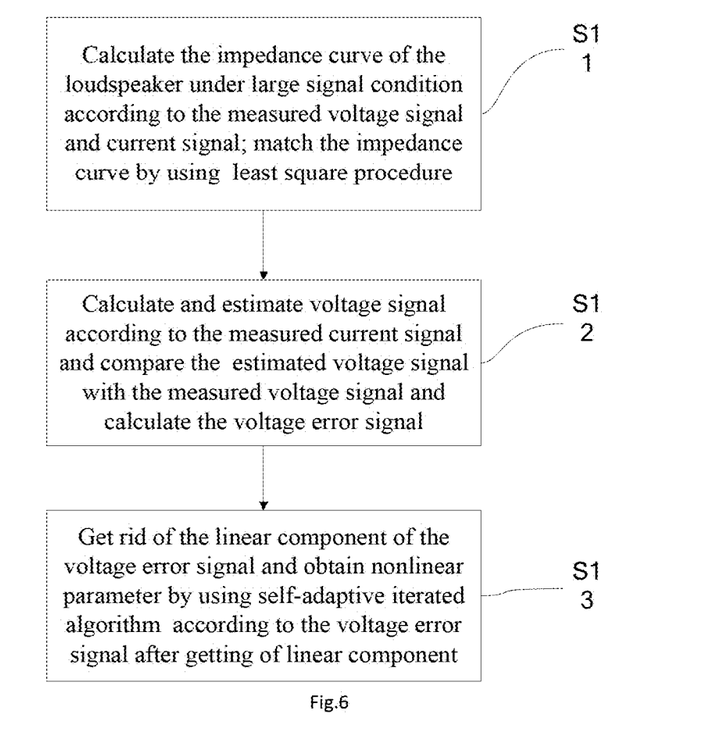
FIG. 6 is method flow chart corresponding that shown in FIG. 5 of obtaining system parameter of loudspeaker by using system recognition method.

FIG. 5 shows a basic block diagram of loudspeaker nonlinear method of compensation for obtaining the system parameter by the system identification method of loudspeaker according to an embodiment of the present invention. In addition to the non-linear compensation shown in FIG. 1, FIG. 5 shows further the online tracking and updating of the system parameter P(n). In FIG. 5, i(n) represents the real-time current of the loudspeaker. Since the compensated voltage u(n) is substantially the same as the real-time voltage of the loudspeaker, it is assumed that u(n) is the real-time voltage of the loudspeaker. As shown in FIG. 5, the voltage u(n) and the current i(n), at both ends of the loudspeaker are simultaneously measured, the voltage u(n) and the current i (n) are input to the system identifier 40 to update the system parameter. In this way, the changes of system parameter can be tracked online, and enhance further the loudspeaker's nonlinear compensation effect, wherein the system identification method is used in the system identifier 40 to implement the updating of the system parameter only. FIG. 6 shows specifically the system identification method. As shown in FIG. 6, the system identification method includes the following steps:

S11, according to the measured voltage signal and current signal, under the large signal conditions, calculate the impedance curve of the loudspeaker, and use the least squares method to match the impedance curve, and obtain the linear parameters of the loudspeaker;

S12, calculate the estimated voltage signal based on the measured current signal, and compare the estimated voltage signal with the measured voltage signal to calculate the voltage error signal between the two factors;

S13, the linear component in the voltage error signal is removed and the nonlinear parameter is obtained by the adaptive iterative algorithm according to the voltage error signal after removing the linear component.

In the process of non-linear compensation, the system identification method can be used to track the system parameter changes online, and provide the updated system parameter. Therefore, it is possible to avoid effectively the problem that the system nonlinearity cannot be completely suppressed due to the error of the system parameter measurement and the drift of the parameters of the loudspeaker operation, and the nonlinear compensation effect of the loudspeaker can be further improved.

Figure 7:
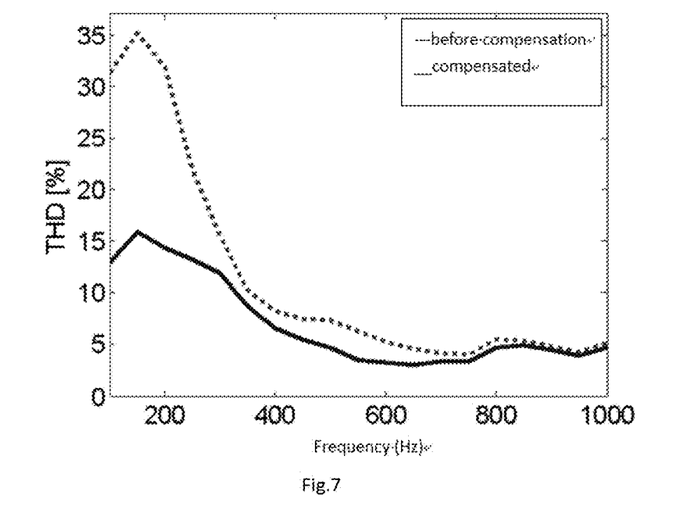
FIG. 7 is the sound pressure THD diagram before and after use loudspeaker nonlinear method of compensation of the invention to have the nonlinear compensation for the loudspeaker unit.

FIG. 7 shows the sound pressure THD before and after the non-linear compensation of the loudspeaker unit by the loudspeaker nonlinear method of compensation of the present invention. As shown in FIG. 7 in the present embodiment, the diaphragm has a diaphragm length of 1.6 cm and a width of 0.9 cm. By the single frequency signal of 100 Hz to 1000 Hz, the loudspeaker unit can obtain the uncompensated sound pressure THD (Total Harmonic Distortion) shown by the dotted line in FIG. 7. The single-frequency signal of 100 Hz to 1000 Hz is then compensated by the non-linear compensation method proposed in the present invention and the loudspeaker unit is excited by the compensated single-frequency signal to obtain the compensated sound pressure THD shown by the solid line in FIG. 7. Here, the effective excitation voltage of the loudspeaker unit in FIG. 7 is 0.5V.

Figure 8:
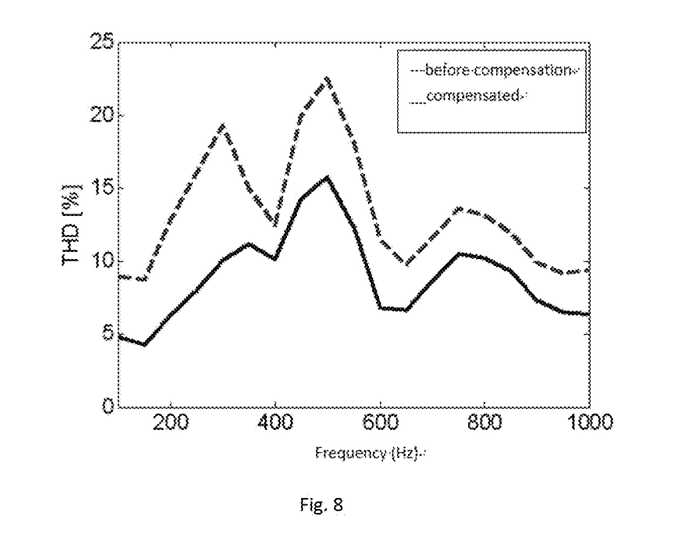
FIG. 8 is the sound pressure THD diagram before and after use the loudspeaker nonlinear method of compensation of the invention to have the linear compensation for loudspeaker system containing cavity.

And FIG. 8 is the sound pressure THD before and after the compensation of the loudspeaker system with the cavity under the same conditions. Where the dotted line represents the sound pressure THD before the compensation and the solid line represents the compensated sound pressure THD, and the effective excitation voltage of the loudspeaker system is 1.2V.

Refer to FIGS. 7-8, the sound pressure THD is significantly reduced after the excitation voltage signal of the loudspeaker is compensated by the non-linear compensation method proposed in the present invention, so it can effectively compensate the non-linearity of the loudspeaker.

Figure 9:
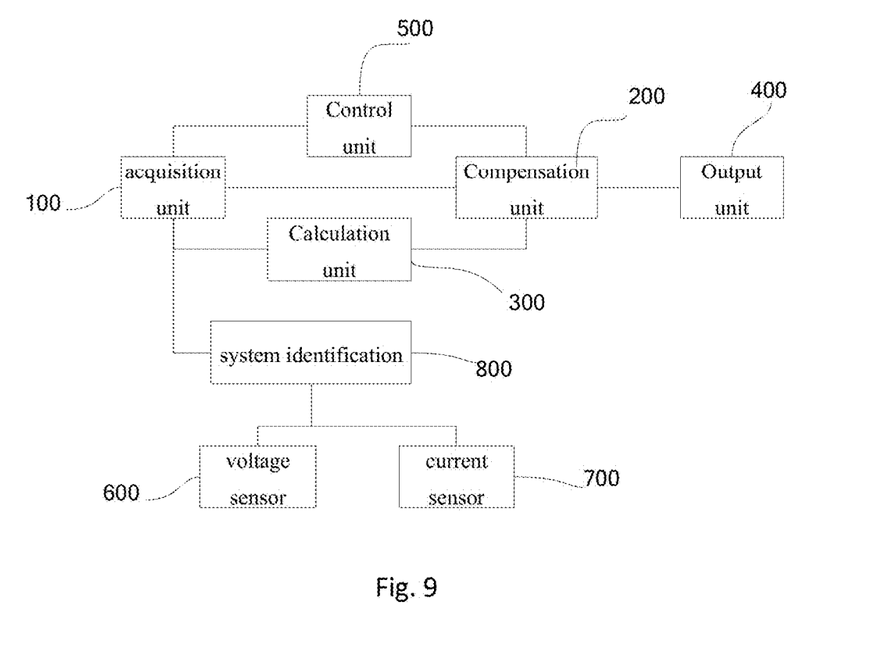
FIG. 9 is the module block diagram of nonlinear compensating device of loudspeaker in the example of the invention.

The present invention provides further a loudspeaker non-linear compensation device. FIG. 9 shows a block diagram of a loudspeaker nonlinear compensation device according to an embodiment of the present invention. As shown in FIG. 10, the loudspeaker nonlinear compensation device includes generally an acquisition unit 100, a compensation unit 200, a calculation unit 300, an output unit 400, and a control unit 500.

In particular, the acquisition unit 100 is used to acquire the system parameter of the loudspeaker, the current time domain excitation voltage signal, and the current state vector. The compensation unit 200 is in communication with the acquisition unit 100 for compensating the current time domain excitation voltage signal based on the system parameter acquired by the acquisition unit 100 and the current state vector, and returns the current compensation voltage signal. The calculation unit 300 is connected to the acquisition unit 100 and the compensation unit 200 respectively, which is used to calculate and obtain the next state vector based on the system parameter acquired by the acquisition unit 100 and the current compensation voltage signal obtained by the compensation unit 200, calculate the next state vector that is sent to the acquisition unit 100 to update the state vector. And the output unit 400 is electrically connected to the compensation unit 200 for outputting the current compensation voltage signal.

The control unit 500 is electrically connected to the compensation unit 200 and the acquisition unit 100 respectively for recording the number of the compensation voltage signals obtained by the compensation unit 200. The control unit 500 can control the loudspeaker non-linear compensation device to stop the operation when the number of the compensation voltage signals is equal to the preset value;

And the control unit 100 can again acquire the system parameter of the loudspeaker, the current time domain excitation voltage signal, and the current state vector when the number of the compensation voltage signals does not reach the preset value.

Among which, the current state vector is preferably a preset vector at the time of the first compensation, in the present embodiment, the preset state vector is preferably x1=[0 0 0]T.

In the subsequent compensation process, the current state vector is obtained by the previous compensation voltage signal and the system parameter, for example, solving the ordinary differential equation. Wherein, the expression of the state vector, system parameter and ordinary differential equation can be referred to the formulas (1), (2) and (5), respectively.

Further as shown in FIG. 9, in order to enhance further the compensation effect of the nonlinear compensation device, in the present embodiment, the speaker nonlinear compensation device includes further a voltage sensor 600, a current sensor 700, and a system identification unit 800. Wherein, the voltage sensor 600 is used to measure synchronously the voltage signal across the loudspeaker and the current sensor 700 is used to measure synchronously the current signal across the loudspeaker. The system identification unit 800 is used to obtain the system parameter of the loudspeaker based on the measured voltage signal and the measured current signal, thereby track the change of the system parameter of the loudspeaker on-line and enhance further the nonlinear compensation effect of the loudspeaker.

It has the following advantages to use the loudspeaker nonlinear method of the compensation and apparatus of the present invention: 1) it is not only able to compensate force factor Bl(x) and coefficient of stiffness $k_t(x)$ but also compensate the resistance $R_m(v)$ because it involves the velocity of diaphragm v of the loudspeaker, its wide applicability is especial for the micro-speaker non-linear suppression of large signal conditions; 2) compensate the excitation voltage signal in the time domain directly, and it is not necessary to change the audio signal into frequency at first; 3) The state vector of the loudspeaker is predicted by solving the ordinary differential equation, which eliminates the need for additional sensors to detect, reduces the cost and simplifies the signal compensation process; 4) system parameter can be automatically updated by the adaptive system identification method, which can track the system parameter changes online to enhance further the nonlinear compensation effect.

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A loudspeaker nonlinear compensation method including the following steps of:
S1: obtaining system parameters of a loudspeaker, No. i time-domain excitation voltage signal and the No. i state vector of the loudspeaker, among which i is natural number, obtaining system parameter of the loudspeaker including the following steps: measuring the voltage signal and current signal on both ends of the loudspeaker synchronously; utilizing system identification method to obtain the system parameter of the loudspeaker;
S2: compensating the No. i time-domain excitation voltage signal according to the system parameter and the No. i state vector, and then obtaining No. i compensation voltage signal;
S3: obtaining No. i+1 state vector according to system parameter and the calculation of No. i compensation voltage signal;
S4: output the No. i compensation voltage signal and record quantity of the compensation voltage signal;
S5: judging whether quantity of the compensation voltage signal is equal to a predetermined value; If so, terminate compensation; if not, command i=i+1, return to execute step S1;
the system parameter including linear parameters and nonlinear parameters; the linear parameters including voice coil DC resistance, voice coil inductance, force factor linear term, stiffness factor linear term and mechanical resistance linear term; the nonlinear parameters including force factor, coefficient of stiffness and mechanical resistance, where the force factor, the coefficient of stiffness and the mechanical resistance are represented respectively are:

$$Bl(x) = \sum_{j=0}^{N} b_j x^j$$

$$k_t(x) = \sum_{j=0}^{N} k_j x^j$$

$$R_m(v) = \sum_{j=1}^{N} r_j v^j,$$

where, x represents the displacement of vibrating diaphragm of loudspeaker, v represents the velocity of vibrating diaphragm of loudspeaker, Bl(x) represents force factor, kt(x) represents coefficient of stiffness, Rm(v) represents mechanical resistance;

the state vector of the loudspeaker including current, displacement of vibrating diaphragm and velocity of vibrating diaphragm, the state vector being shown as:

$$x=[x_1 x_2 x_3]^T=[i x v]^T$$

in step S3, the i+1 state vector is obtained through resolving ordinary differential equation according to the system parameter and the No. i compensation voltage signal, the ordinary differential equation of the loudspeaker is:

$$\dot{x} = \begin{bmatrix} -\dfrac{R_e}{L_e} x_1 - \dfrac{Bl(x_2)}{L_e} x_3 + \dfrac{u(t)}{L_e} \\ x_3 \\ \dfrac{Bl(x_2)}{m_t} x_1 - \dfrac{k_t(x_2)}{m_t} x_2 - \dfrac{R_m(x_3)}{m_t} x_3 \end{bmatrix}$$

where, u(t) is excitation voltage, Re is voice coil DC resistance, Le is voice coil inductance, mt is equivalent vibration quality;

wherein the system identification method includes the following steps:

Calculating the impedance curve of the loudspeaker under large signal condition according to the measured voltage signal and current signal; matching the impedance curve by using least square procedure; obtaining the linear parameters of the loudspeaker;

Calculating and estimating voltage signal according to the measured current signal and comparing the estimated voltage signal with the measured voltage signal and calculate the voltage error signal between them;

Getting rid of the linear component of the voltage error signal and obtain nonlinear parameter by using self-adaptive iterated algorithm according to the voltage error signal after getting rid of linear component.

2. The loudspeaker nonlinear compensation method as described in claim 1, wherein when i=1 among the step S1, the No. i state vector is the preset state vector of loudspeaker.

3. The loudspeaker nonlinear compensation method as described in claim 1, wherein in step S2, compensate the No. i time-domain excitation voltage signal through feedback linearization compensation algorithm to obtain the No. i compensation voltage signal.

\* \* \* \* \*